US008866311B2

(12) United States Patent
Chen et al.

(10) Patent No.: US 8,866,311 B2
(45) Date of Patent: Oct. 21, 2014

(54) SEMICONDUCTOR PACKAGE SUBSTRATES HAVING PILLARS AND RELATED METHODS

(71) Applicant: Advanced Semiconductor Engineering, Inc., Kaohsiung (TW)

(72) Inventors: Tien-Szu Chen, Taoyuan (TW);
Kuang-Hsiung Chen, Taoyuan (TW);
Sheng-Ming Wang, Taoyuan (TW);
Hsiang-Ming Feng, Zhongli (TW);
Yen-Hua Kuo, Luzhu Township (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 60 days.

(21) Appl. No.: 13/624,548

(22) Filed: Sep. 21, 2012

(65) Prior Publication Data

US 2014/0084475 A1    Mar. 27, 2014

(51) Int. Cl.
*H01L 23/48*    (2006.01)

(52) U.S. Cl.
USPC ...... 257/781; 438/667; 257/773; 257/E23.02; 257/E23.021

(58) Field of Classification Search
USPC ............... 257/781, E23.021, E23.02, 773; 438/667
See application file for complete search history.

(56) References Cited

U.S. PATENT DOCUMENTS

| 6,005,198 | A | * | 12/1999 | Gregoire ........................ 174/262 |
| 6,177,636 | B1 | | 1/2001 | Fjelstad |
| 6,578,754 | B1 | | 6/2003 | Tung |
| 6,592,019 | B2 | | 7/2003 | Tung |
| 6,599,775 | B2 | | 7/2003 | Tie et al. |
| 6,732,913 | B2 | | 5/2004 | Alvarez |
| 6,878,465 | B2 | * | 4/2005 | Moon et al. .................... 428/650 |
| 6,929,981 | B2 | | 8/2005 | Hwee et al. |
| 7,087,458 | B2 | | 8/2006 | Wang et al. |
| 7,462,942 | B2 | | 12/2008 | Tan et al. |
| 7,932,170 | B1 | | 4/2011 | Huemoeller et al. |

* cited by examiner

*Primary Examiner* — S. V. Clark
*Assistant Examiner* — Krista Soderholm
(74) *Attorney, Agent, or Firm* — Klein, O'Neill & Singh, LLP

(57) ABSTRACT

The substrate includes a first dielectric layer, a first circuit pattern, a plurality of pillars and a second circuit pattern. The first dielectric layer has opposing first and second dielectric surfaces. The first circuit pattern is embedded in the first dielectric layer and defines a plurality of curved trace surfaces. Each of the pillars has an exterior surface adapted for making external electrical connection and a curved base surface abutting a corresponding one of the trace surfaces. The second circuit pattern is on the second dielectric surface of the first dielectric layer and electrically connected to the first circuit pattern.

19 Claims, 14 Drawing Sheets

US 8,866,311 B2

SEMICONDUCTOR PACKAGE SUBSTRATES HAVING PILLARS AND RELATED METHODS

TECHNICAL FIELD

The present embodiments relate to a semiconductor package substrate having pillars and related methods.

BACKGROUND

Some semiconductor package substrates include a plurality of pillars for connecting solder bumps of a semiconductor die to the substrate. After a reflow process, solder joints are formed between the die and the pillars, so that the die is bonded to the pillars and the electrical connection therebetween is secured. The pillars may be formed by electroplating. However, unpredictable and variable plating parameters in the plating bath often lead to over-plating or under-plating, which, in turn, results in the top surfaces of the plated pillars not being coplanar. The lack of coplanarity negatively affects the solder joint reliability after packaging. Fine pitch solder bumps, wafer level packaging (WLP) and large-scale substrates are particularly sensitive to this issue. The lack of coplanarity can cause a non-uniform electric current density distribution, which is especially serious on micro-scale patterns. This common non-uniform electric current density distribution is not affected by only one factor but by various plating parameters consisting of plating bath design, chemical additives, magnitude of current density, use of current type, distance between cathode and anode, agitation method, chemical maintenance, pre-cleaning solution, configurations, arrangements and volumes of patterns, high aspect ratio, etc. It is difficult to control the height deviation to within 5 μm across the whole substrate, particularly if there is a need to add leveling agent, wetting agent, or brightener to the plating bath.

SUMMARY

One of the present embodiments is directed to a substrate. The substrate comprises a first dielectric layer having opposing first and second dielectric surfaces. The substrate further comprises a first circuit pattern embedded in the first dielectric layer. The first circuit pattern includes a plurality of traces defining trace surfaces exposed from the first dielectric surface. The trace surfaces include curved portions that are recessed beneath the first dielectric surface. The substrate further comprises a plurality of pillars. Each of the pillars has a curved base surface abutting a corresponding one of the curved portions of the trace surfaces, thereby defining a curved interface between each of the pillars and a corresponding one of the curved portions of the trace surfaces.

Another of the present embodiments is directed to a substrate. The substrate comprises a first dielectric layer having opposing first and second dielectric surfaces. The substrate further comprises a first circuit pattern embedded in the first dielectric layer. The first circuit pattern includes a plurality of traces defining trace surfaces exposed from the first dielectric surface. The trace surfaces define concave portions extending outward from the first dielectric surface. The substrate further comprises a plurality of pillars. Each of the pillars has a convex base surface abutting a corresponding one of the concave portions of the trace surfaces, thereby defining a concave/convex interface between each of the pillars and a corresponding one of the trace surfaces.

Another of the present embodiments is directed to a method of making a substrate. The method comprises forming a patterned layer on a carrier, the patterned layer defining a plurality of openings. The method further comprises forming a plurality of first pillar portions of a plurality of pillars in the plurality of openings in the patterned layer. The method further comprises forming a conductive film covering the plurality of first pillar portions of the plurality of pillars and the patterned layer. The method further comprises forming a first circuit pattern on the patterned layer, the first circuit pattern defining a plurality of trace surfaces. The method further comprises forming a first dielectric layer on the first circuit pattern and the patterned layer. The method further comprises forming a plurality of first openings in the first dielectric layer. The method further comprises forming a plurality of conductive vias in the first dielectric layer and a second circuit pattern on the first dielectric layer, the plurality of conductive vias being in the plurality of first openings in the first dielectric layer, the first circuit pattern being electrically connected to the second circuit pattern via the plurality of conductive vias. The method further comprises forming a second dielectric layer covering portions of the second circuit pattern and defining a plurality of second openings, the second circuit pattern including a plurality of contact pads exposed by the plurality of second openings in the second dielectric layer. The method further comprises removing the carrier. The method further comprises removing the patterned layer. The method further comprises removing portions of the conductive film that are not covered by the first pillar portions, wherein the remaining part of the conductive film forms a plurality of second pillar portions of the plurality of pillars.

BRIEF DESCRIPTION OF THE DRAWINGS

Common reference numerals are used throughout the drawings and the detailed description to indicate the same elements. The present invention will be more apparent from the following detailed description taken in conjunction with the accompanying drawings.

DETAILED DESCRIPTION

Figure 1:
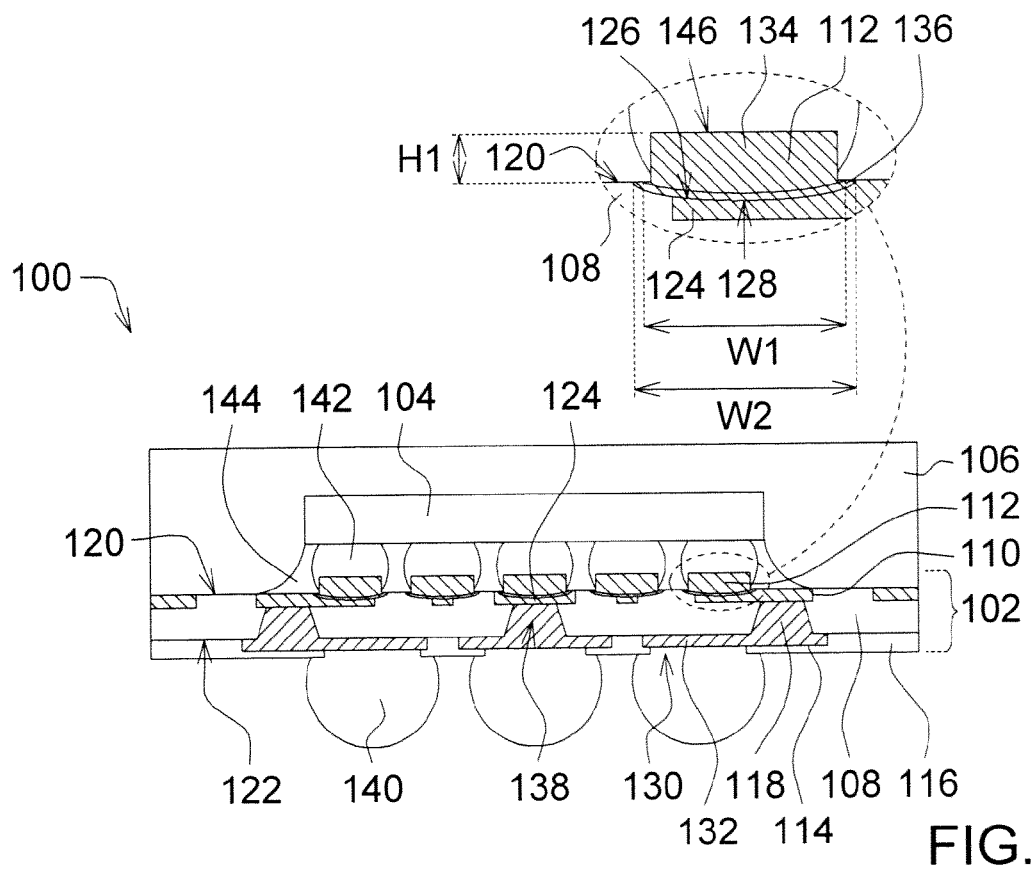
FIG. 1 is a cross-sectional view of a semiconductor package according to one of the present embodiments.

Referring to FIG. 1, a cross-sectional view of a semiconductor package 100 according to one of the present embodiments is illustrated. The semiconductor package 100 includes a substrate 102, a die 104, and a package body 106.

The substrate 102 includes a first dielectric layer 108, a first circuit pattern 110, a plurality of pillars 112, a second circuit pattern 114, and a second dielectric layer 116. The first circuit pattern 110 is electrically connected to the second circuit pattern 114 via a plurality of conductive vias 118. Although the substrate 102 is illustrated as including only two layers of circuit patterns, in other embodiments, the substrate 102 may include any number of layers of circuit patterns, such as three or more.

The first dielectric layer 108 has a first dielectric surface 120 and a second dielectric surface 122. The first dielectric surface 120 is opposite to the second dielectric surface 122. The first dielectric layer 108 may, for example, be made of a fiber-reinforced resin material and/or prepreg (PP) for increased rigidity, or any other material. The fibers may, for example, be glass or aramid or any other material. Examples of resin materials that may be reinforced by fibers for use in the laminated dielectric material include Ajinomoto build-up film (ABF), bismaleimide triazine (BT), prepreg, polyimide (PI), liquid crystal polymer (LCP), epoxy, and other resin materials.

The first circuit pattern 110 is embedded in the first dielectric layer 108. With reference to the magnified inset of FIG. 1, the first circuit pattern 110 includes a plurality of traces 124. The traces 124 are embedded in the first dielectric layer 108, except for a plurality of curved trace surfaces 126 that are exposed from the first dielectric surface 120. The trace surfaces 126 are recessed below the first dielectric surface 120.

Each of the pillars 112 has an exterior surface 146 for making external electrical connection (for example, to another electrical connection in a semiconductor chip), and a curved base surface 128 contacting a corresponding one of the trace surfaces 126, which are also curved. In other words, the pillars 112 and the traces 124 have a curved interface there between, with the pillar base surfaces 128 being convex and the trace surfaces 126 being concave.

Each of the pillars 112 further includes a first pillar portion 134 and a second pillar portion 136. The first pillar portion 134 has a first maximum width W1. The second pillar portion 136 has a second maximum width W2. The second maximum width W2 may be greater than the first maximum width W1. Thus, edges of the curved base surface 128 are located laterally outside the first pillar portion 134.

The exterior surfaces 146 of the pillars 112 have a high coplanarity, since they are formed from the same surface of a conductive film on a substantially planar rigid carrier, as further discussed below. The high coplanarity improves the reliability of the semiconductor package 100 when the substrate 102 is electrically connected to the die 104 via the plurality of pillars 112. In certain embodiments, the coplanarity of the exterior surfaces 146 of the pillars 112 is ±3 μm. In other words, the height H1 deviation of the pillars 112 from the desired and expectative dimension is within the range of 3 μm, where the height H1 is defined as the distance between the exterior surface 146 of the pillar 112 and the first dielectric surface 120 of the first dielectric layer 108. In these embodiments, the difference between the greatest value of the heights H1 and the least value of the heights H1 6 μm or less. In other words, the variation of the heights H1 is 6 μm or less. Alternatively, the difference between the greatest value of the heights H1 and the least value of the heights H1 may be less than 10% of the desired and expected dimension. The material of the pillars 112 may be copper or any other material.

The second circuit pattern 114 is disposed on the second dielectric surface 122 of the first dielectric layer 108. The second dielectric layer 116 partially covers the second circuit pattern 114. The second dielectric layer 116 defines a plurality of openings 130 exposing portions of the second circuit pattern 114 to form a plurality of contact pads 132. The second dielectric layer 116 may be solder mask, for example, or any other material. The contact pads 132 may be used for electrical connection externally of the semiconductor package 100, such as electrical connection to another semiconductor package or to other components on a circuit board. For example, an electrical contact 140, such as a solder ball, may be electrically connected to and disposed adjacent a corresponding one of the contact pads 132. Each of the plurality of conductive vias 118 extends from the first circuit pattern 110 to the second circuit pattern 114 through a corresponding one of the plurality of openings 138 in the first dielectric layer 108. Each of the plurality of conductive vias 118 electrically connects the first circuit pattern 110 to the second circuit pattern 114. The plurality of traces 124 of the first circuit pattern 110 electrically connects each of the plurality of pillars 112 to a corresponding one of the plurality of conductive vias 118, and to a corresponding one of the plurality of contact pads 132.

The die 104 may be electrically connected to the plurality of pillars 112 via a plurality of fused conductive bumps 142, or through any other technique. The plurality of fused conductive bumps 142 may be made of a conductive material, such as solder, or any other material. An underfill layer 144 may be formed between the die 104 and the substrate 102.

The package body 106 substantially covers or encapsulates the die 104, the first circuit pattern 110, the plurality of pillars 112, and the plurality of fused conductive bumps 142 to provide mechanical stability as well as protection against oxidation, humidity, and other environmental conditions. The package body 106 may be made of a molding material that can include, for example, a Novolac-based resin, an epoxy-based resin, a silicone-based resin, or any other suitable encapsulant. Suitable fillers can also be included, such as powdered SiO2 or any other filler(s).

Figure 2:
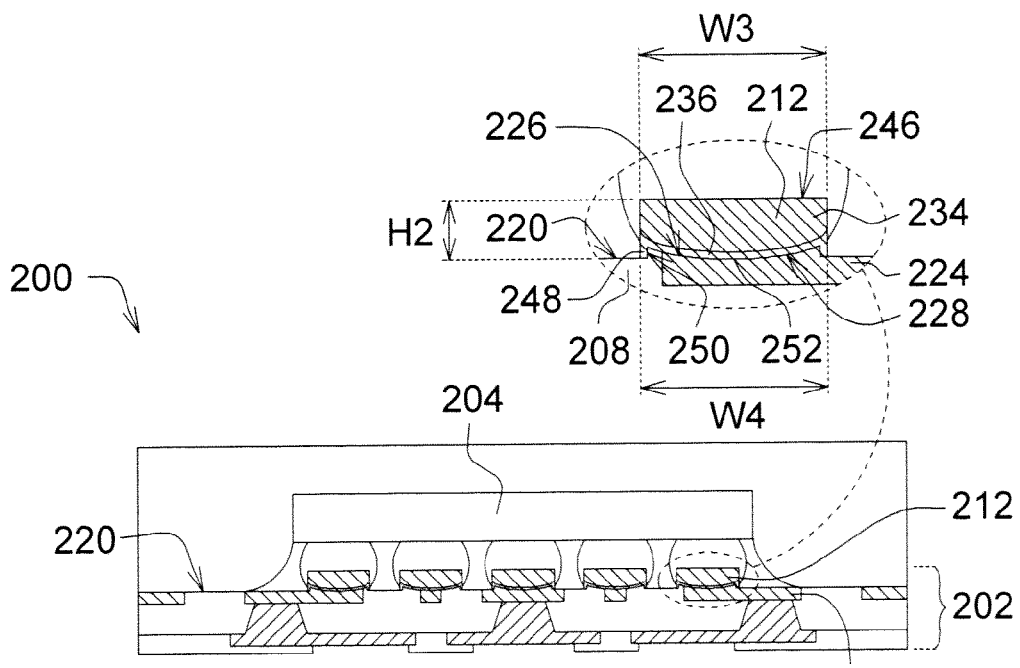
FIG. 2 is a cross-sectional view of a semiconductor package according to another of the present embodiments.

FIG. 2 illustrates a cross-sectional view of a semiconductor package 200 according to another of the present embodiments. The semiconductor package 200 is similar to the semiconductor package 100 described with reference to FIG. 1. Therefore, only those aspects of the semiconductor package 200 that differ from the semiconductor package 100 are discussed here. With reference to the magnified inset of FIG. 2, each pillar 212 has an exterior surface 246 for making external electrical connection (for example, to another electrical connection in a semiconductor chip) and a curved base surface 228 contacting a corresponding one of the trace surfaces 226 of the traces 224. In other words, the pillars 212 and the traces 224 have a curved interface there between, with the pillar base surfaces 228 being convex and the trace surfaces 226 being concave. In contrast to the semiconductor package 100 of FIG. 1, the trace surfaces 226 are elevated above the first dielectric surface 220. An apex 252 of the curve defined by each of the pillar base surfaces 228/trace surfaces 226 lies substantially in the plane defined by the first dielectric layer 208.

Each of the pillars 212 further includes a first pillar portion 234 and a second pillar portion 236. Each of the second pillar portions 236 has a projecting portion 248 that projects from an outer edge of the curved base surface 228 and surrounds the concave portions of the traces 224. The projecting portion 248 has a side surface 250 adjacent the curved base surface 228 of the second pillar portion 236. The side surface 250 and the curved base surface 228 meet at an acute angle. The first pillar portion 234 has a first maximum width W3. The second pillar portion 236 has a second maximum width W4. The first and second maximum widths W4 are substantially equal. A cross-sectional width of the curved base surface 228 is less than a cross-sectional width of the first pillar portion 234, such that edges of the curved base surface 228 are located radially inward of the first pillar portion 234.

Referring to FIG. 2, the pillars 212 have a high coplanarity since they are formed from the same surface of a conductive film on a substantially planar rigid carrier, as further discussed below. The high coplanarity improves the reliability of the semiconductor package 200 when the substrate 202 is electrically connected to the die 204 via the plurality of pillars 212. In certain embodiments, the height tolerances of the pillars 112 are as described above with respect to the semiconductor package 100 of FIG. 1. The material of the pillars 212 may copper or any other material.

The substrates 102 and 202 are not limited for flip chip bonding applications as shown in FIGS. 1 and 2. In other embodiments, the substrates 102 and 202 may be used for other applications, such as wire bonding applications or any other applications.

Figure 3A:
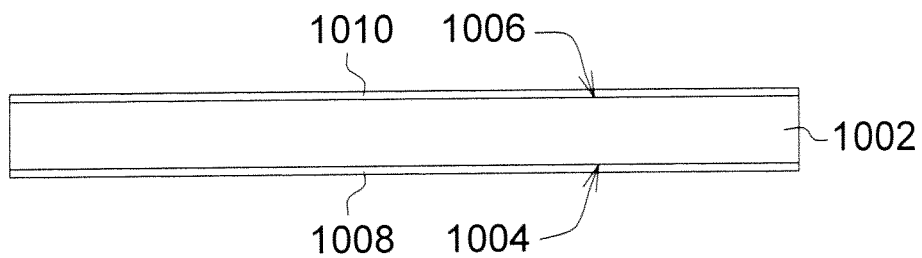
FIGS. 3A-3N illustrate one embodiment of a method of making the substrate shown in FIG. 1.
Figure 3B:
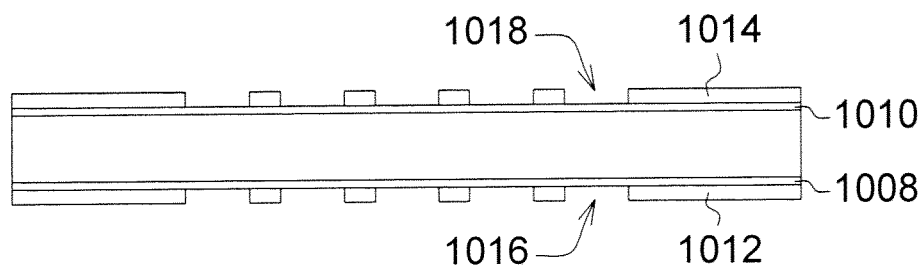
Figure 3C:
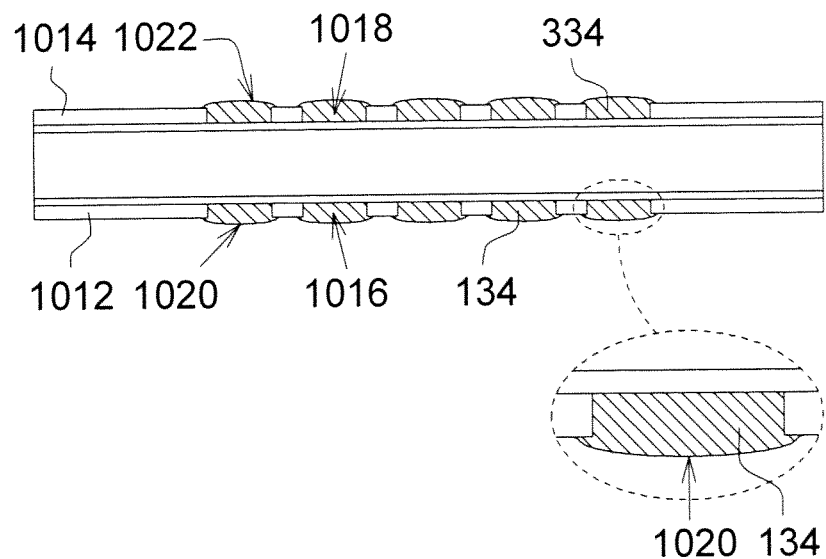
Figure 3D:
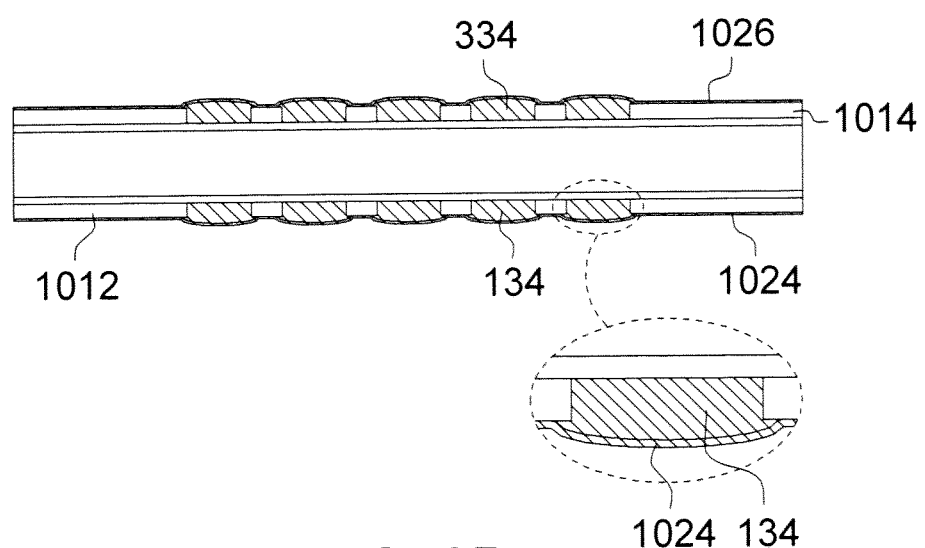
Figure 3E:
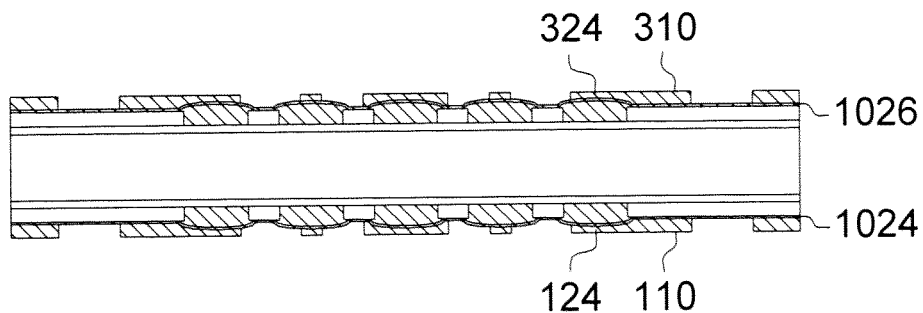
Figure 3F:
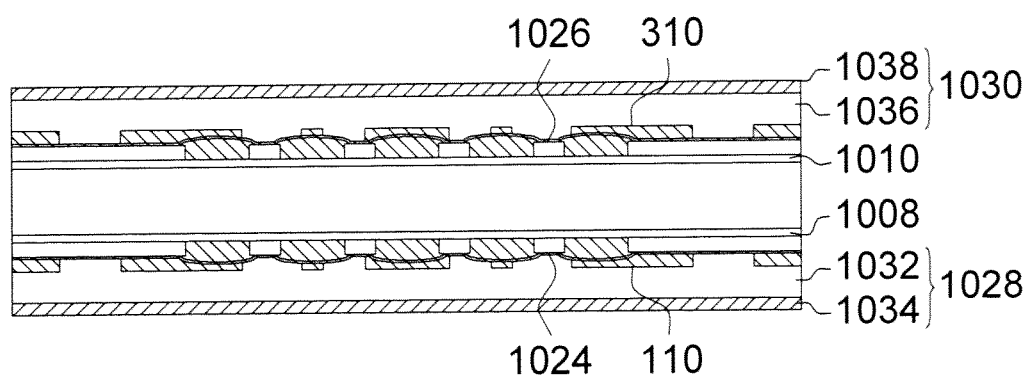
Figure 3G:
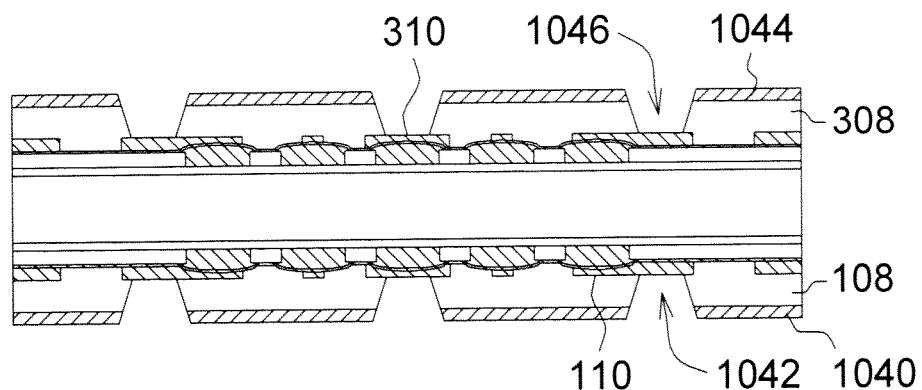
Figure 3H:
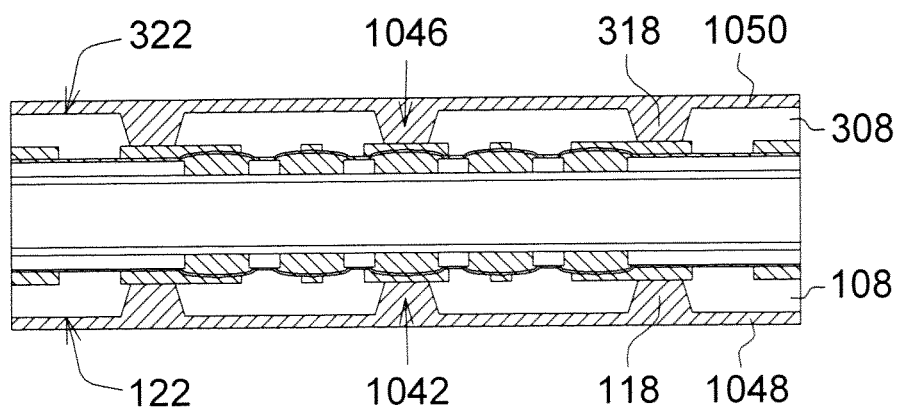
Figure 3I:
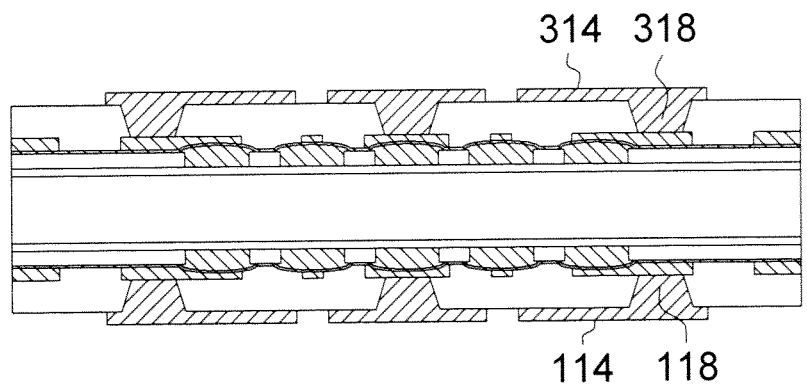
Figure 3J:
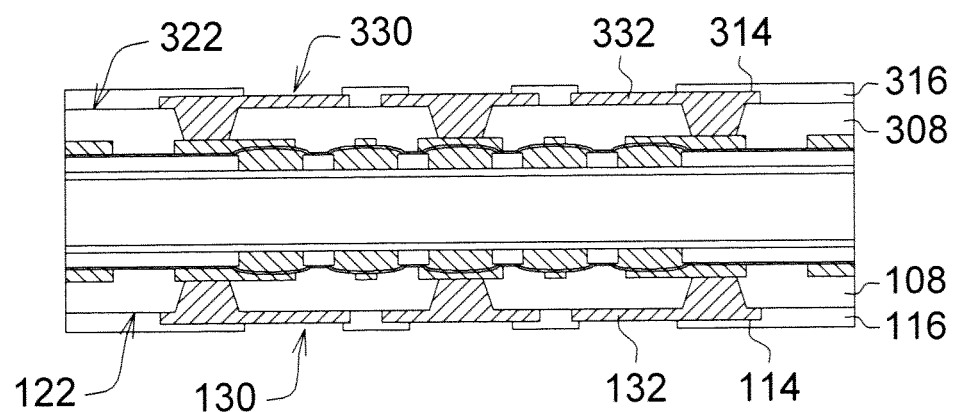
Figure 3K:
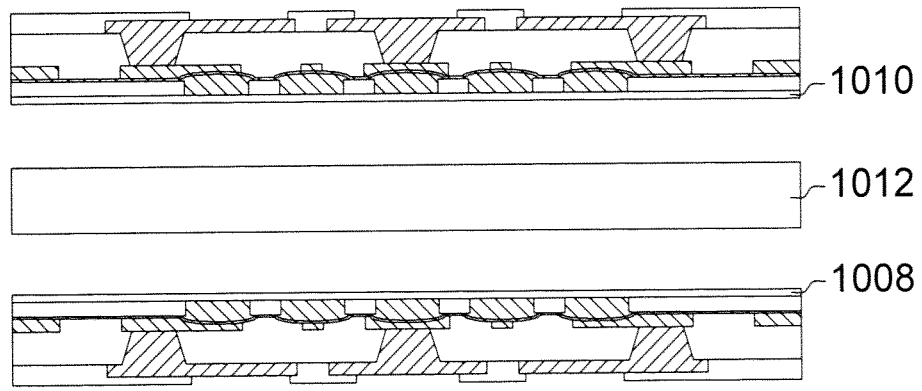
Figure 3L:
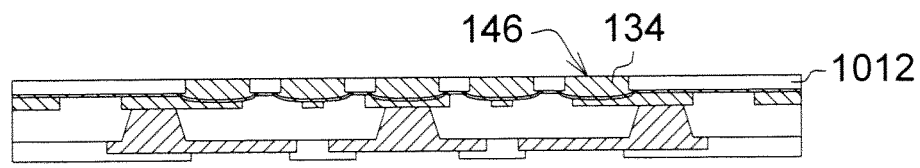
Figure 3M:
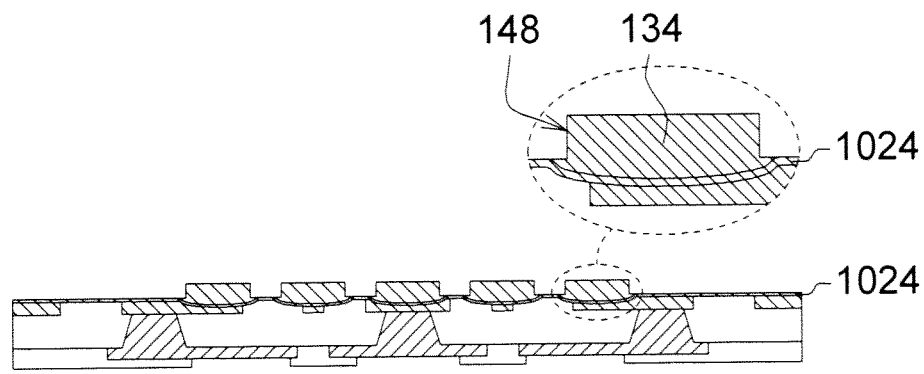
Figure 3N:
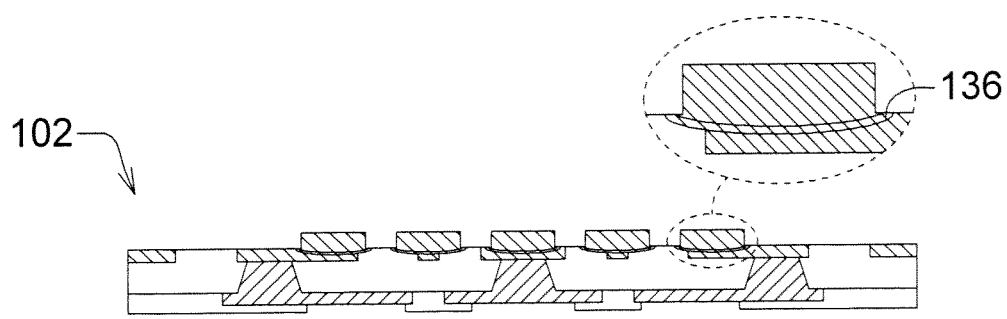

FIGS. 3A through 3N illustrate a method of making a substrate, according to one of the present embodiments. For ease of presentation, the following steps are described with reference to the substrate 102 of the semiconductor package 100 of FIG. 1.

FIG. 3A illustrates a substantially planar rigid carrier 1002. In certain embodiments, the carrier 1002 may include a core layer (not shown) between two carrier conductive layers (not shown) attached to the core layer. Each carrier conductive layer may be formed from a metal, a metal alloy, a matrix with a metal or a metal alloy dispersed therein, or any other suitable electrically conductive material. For example, each carrier conductive layer may include a metal foil formed from copper or a copper alloy. The metal foil may have a thickness in the range from about 10 µm to about 30 µm, such as in the range from about 15 µm to about 25 µm.

The carrier 1002 has a lower surface 1004 and an upper surface 1006. A conductive layer 1008 is disposed adjacent the lower surface 1004, and a conductive layer 1010 is disposed adjacent the upper surface 1006. Each of the conductive layers 1008, 1010 may be formed from a metal, a metal alloy, a matrix with a metal or a metal alloy dispersed therein, or any other suitable electrically conductive material. For example, the conductive layers 1008, 1010 may include a releasable metal foil formed from copper or a copper alloy. The conductive films 1008, 1010 may be attached to the carrier 1002 by a release layer (not shown). In certain embodiments, the release layer is an adhesive layer that may be organic or inorganic, such as tape. The tape, which can be implemented as a single-sided or double-sided adhesive tape, secures components at an appropriate spacing with respect to one another, and allows subsequent steps to be carried out with those components disposed adjacent the carrier 1002. Each of the conductive layers 1008, 1010 may have a thickness in the range from about 2 µm to about 20 µm, such as in the range from about 3 µm to about 5 µm, from about 3 µm to about 10 µm, from about 10 µm to about 20 µm, and from about 15 µm to about 20 µm.

Referring to FIG. 3B, patterned layers 1012, 1014 are formed adjacent the conductive films 1008, 1010, respectively. The patterned layers 1012, 1014 define a plurality of openings 1016, 1018 exposing the conductive films 1008, 1010. The patterned layers 1012, 1014 may be formed from a photoresist layer that may be a dry film photoresist, or any other type of patternable layer or dielectric layer. Selected portions of the photoresist layer may be photoimaged and developed so as to create the openings 1016, 1018. The photoresist layer may be photochemically defined using a photomask (not shown). Photoimaging and developing may have advantages of lower cost and decreased process time as compared to other approaches for creating the openings 1016, 1018 in the patterned layers 1012, 1014, but any technique may be used. The resulting openings 1016, 1018 can have any shape, including cylindrical, such as circular cylindrical, elliptical cylindrical, square cylindrical, or rectangular cylindrical, or a non-cylindrical shape, such as a cone, a funnel, or any other tapered shape.

Referring to FIG. 3C, a conductive material is filled into the openings 1016, 1018 in the patterned layers 1012, 1014 to form the first pillar portions 134, 334. In this embodiment, the openings 1016, 1018 are overfilled with the conductive material by electrolytic plating such that the resulting first pillar portions 134, 334 protrude from the patterned layers 1012, 1014 and form the curved base surfaces 1020, 1022 (e.g., the convex surfaces described above). The first pillar portions 134, 334 may be formed from a metal, a metal alloy, a matrix with a metal or a metal alloy dispersed therein, or any other suitable electrically conductive material. For example, the first pillar portions 134, 334 may include one or more layers of copper or a copper alloy.

Referring to FIG. 3D, two conductive films 1024, 1026 are formed over the first pillar portions 134, 334 and the patterned layers 1012, 1014, respectively. In certain embodiments, the conductive films 1024, 1026 may be formed by sputtering. By overfilling the openings 1016, 1018, the opportunity for voids or dead spaces in the openings 1016, 1018 is reduced, thereby preventing open circuit issues. The conductive films 1024, 1026 may be formed from a metal, a metal alloy, a matrix with a metal or a metal alloy dispersed therein, or any other suitable electrically conductive material. For example, the conductive films 1024, 1026 may include one or more layers of copper or a copper alloy. As a further example, the conductive films 1024, 1026 may be a sputtered copper film.

Referring to FIG. 3E, the first circuit patterns 110, 310 are formed on the conductive films 1024, 1026. The first circuit patterns 110, 310 include traces 124, 324 contacting the conductive films 1024, 1026 and conforming thereto to form curved interfaces. In certain embodiments, the first circuit patterns 110, 310 are formed by forming patterned photoresist layers (not shown) defining openings exposing portions of the conductive films 1024, 1026, then filling the openings in the patterned photoresist layers with an electrically conductive material (for example, by electrolytic plating using the conductive films 1024, 1026 as a cathode), and then removing the patterned photoresist layers. Alternatively, the first circuit patterns 110, 310 may be formed by forming conductive material layers (not shown) covering the conductive films 1024, 1026, then forming photoresist patterns (not shown) defining openings exposing portions of the conductive material layers, then removing portions of the conductive material layers exposed from the openings of the photoresist patterns by etching, wherein the remaining portions of the conductive material layers forms the first circuit patterns 110, 310, and then removing the photoresist layers. The first circuit patterns 110, 310 may be formed from a metal, a metal alloy, a matrix with a metal or a metal alloy dispersed therein, or any other suitable electrically conductive material, and may be either sputtered or plated, and patterned. In certain embodiments, the first circuit patterns 110, 310 are formed from copper.

Referring to FIG. 3F, a film 1028 is laminated on the first circuit pattern 110 and the conductive film 1024, and a film 1030 is laminated on the first circuit pattern 310 and the conductive film 1026. The film 1028 may include a dielectric layer 1032 laminated on the first circuit pattern 110 and the conductive film 1024, and a conductive film 1034 covering the dielectric layer 1032. The film 1030 may include a dielectric layer 1036 laminated on the first circuit pattern 310 and the conductive film 1026, and a conductive film 1038 covering the dielectric layer 1036. The conductive films 1034, 1038 may be formed from similar materials as the conductive films 1008, 1010.

The dielectric layers 1032, 1036 may be made of a fiber-reinforced resin material and/or prepreg (PP) for increased rigidity. The fibers may be glass or aramid, for example, or any other material. The dielectric layers 1032, 1036 may be formed from a film reinforced with fibers to strengthen the dielectric material. Examples of resin materials that may be reinforced by fibers for use in the laminated dielectric material include Ajinomoto build-up film (ABF), bismaleimide triazine (BT), prepreg, polyimide (PI), liquid crystal polymer (LCP), epoxy, and other resin materials. The resin material may be partially cured. In certain embodiments, the dielectric layers 1032, 1036 are preformed to define openings at locations corresponding to the first circuit patterns 110, 310.

Alternatively, the dielectric layers 1032, 1036 may be formed of an unreinforced, less rigid material, such as solder mask (solder resist), resin materials including but not limited to Ajinomoto build-up film (ABF), bismaleimide triazine (BT), prepreg, polyimide (PI), liquid crystal polymer (LCP), and epoxy, or any other type of patternable layer or dielectric layer. This material may be applied using any coating technique, such as printing, spinning, or spraying, for example.

Referring to FIG. 3G, next, portions of the dielectric layer 1032 and the conductive film 1034 of the film 1028 shown in FIG. 3F is removed to form the first dielectric layer 108 and a patterned conductive film 1040 defining a plurality of openings 1042 exposing portions of the first circuit pattern 110. In addition, portions of the dielectric layer 1036 and the conductive film 1038 of the film 1030 as shown in FIG. 3F are removed to form the first dielectric layer 308 and a patterned conductive film 1044 defining a plurality of openings 1046 exposing portions of the first circuit pattern 310. In certain embodiments, the openings 1046 may be formed by laser drilling holes in the conductive films 1040, 1044 and plasma etching the dielectric layers 1032, 1036 (FIG. 3F) exposed in the laser-drilled holes. Alternatively, the openings 1046 may be formed by chemical etching, or mechanical drilling. The resulting openings 1042, 1046 can have any shape, including cylindrical, such as circular cylindrical, elliptical cylindrical, square cylindrical, or rectangular cylindrical, or a non-cylindrical shape, such as a cone, a funnel, or any other tapered shape. Lateral boundaries of the resulting openings can be curved or roughly textured.

Referring to FIG. 3H, a conductive material is formed in the openings 1042, 1046 in the first dielectric layer 108, 308 and the patterned conductive film 1040, 1044 (FIG. 3G) to form conductive vias 118, 318 and conductive films 1048, 1050 extending from the conductive vias 118, 318 on second dielectric surfaces 122, 322 of the first dielectric layers 108, 308. The conductive films 1048, 1050 may include the patterned conductive films 1040, 1044 as shown in FIG. 3G or further include additional conductive materials that are formed over the patterned conductive films 1040, 1044 as shown in FIG. 3G. In certain embodiments, the conductive vias 118, 318 and the conductive films 1048, 1050 are formed by electroless plating conductive materials (not shown) on sidewalls of the first dielectric layers 108, 308 exposed by the openings 1042, 1046 and on the patterned conductive films 1040, 1044 as shown in FIG. 3G, and then filling another conductive materials in the openings 1042, 1046. In certain embodiments, the conductive vias 118, 318 and the conductive films 1048, 1050 may be formed from a metal, a metal alloy, a matrix with a metal or a metal alloy dispersed therein, or any other suitable electrically conductive material. For example, the conductive vias 118, 318 and the conductive films 1048, 1050 may be formed from copper.

Next, the conductive film 1048 is patterned to form a second circuit pattern 114 electrically connected to the conductive vias 118, as shown in FIG. 3I. In addition, the conductive film 1050 shown in FIG. 3H is patterned to form a second circuit pattern 314 electrically connected to the conductive vias 318. The second circuit patterns 114, 314 may be formed by forming photoresist layers (not shown) defining openings exposing portions of the conductive films 1048, 1050 as shown in FIG. 3H, then removing the portions of the conductive films 1048, 1050 exposed by the openings in the photoresist layers by etching, wherein remaining portions of the conductive films 1048, 1050 form the second circuit patterns 114, 314 as shown in FIG. 3I, and then removing the photoresist layers. Although the second circuit patterns 114, 314 are formed by a subtractive method as described above, they can be formed via a semi-additive process.

Referring to FIG. 3J, a second dielectric layer 116 is formed on the second dielectric surface 122 of the first dielectric layer 108 and on the second circuit pattern 114. The second dielectric layer 116 defines a plurality of openings 130 exposing portions of the second circuit pattern 114 to form a plurality of contact pads 132. A second dielectric layer 316 is formed on the second dielectric surface 322 of the first dielectric layer 308 and on the second circuit pattern 314. The second dielectric layer 316 defines a plurality of openings 330 exposing portions of the second circuit pattern 314 to form a plurality of contact pads 332. The second dielectric layers 116, 316 may be formed from solder resist (solder mask), or any other type of dielectric material.

Referring to FIG. 3K, the carrier 1002 is removed to expose the conductive films 1008, 1010. Next, the conductive layer 1008 is removed to expose the exterior surfaces 146 of the first pillar portions 134 and the patterned layer 1012, as shown in FIG. 3L. The removal process may comprise etching, for example, or any other technique. Next, the patterned layer 1012 is removed to expose sidewalls 148 of the first pillar portions 134 and portions of the conductive film 1024 outside the sidewalls 148 of the first pillar portions 134, as shown in FIG. 3M. The removal process may comprise stripping, for example, or any other technique. Next, the part of the conductive film 1024 outside the sidewalls 148 of the first pillar portions 134, as shown in FIG. 3M, is removed to form second pillar portions 136 of a substrate 102, as shown in FIG. 3N. The removal process may comprise etching, for example, or any other technique.

Figure 4A:
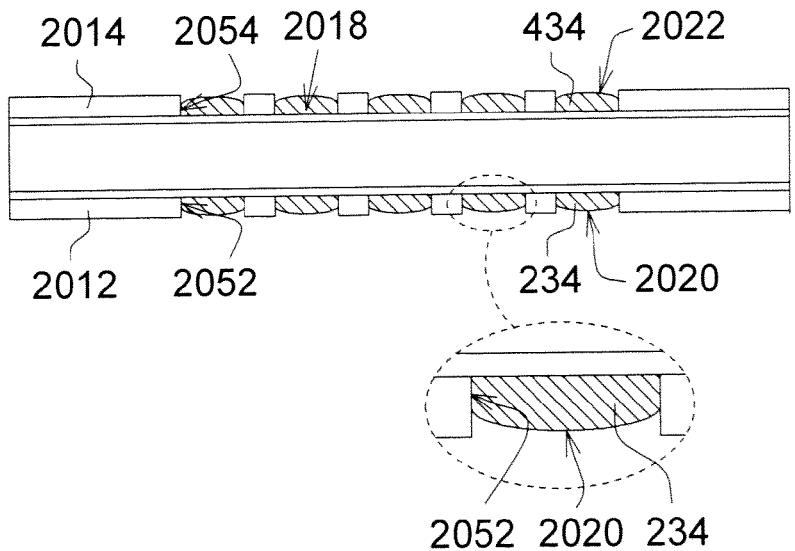
FIGS. 4A-4L illustrate one embodiment of a method of making the substrate shown in FIG. 2.

FIGS. 4A through 4L illustrate a method of making a substrate, according to another of the present embodiments. For ease of presentation, the following steps are described with reference to the substrate 202 of the semiconductor package 200 of FIG. 2. In some embodiments, steps performed before the stage shown in FIG. 4A are similar to those shown in FIGS. 3A and 3B.

Referring to FIG. 4A, in this embodiment, a conductive material is formed in each of openings 2016, 2018 in patterned layers 2012, 2014 to form the first pillar portions 234, 434. Portions of each of sidewalls 2052, 2054 of the patterned layers 2012, 2014 are not covered by the conductive material. The first pillar portions 234, 434 may be formed by plating, for example, or any other process. The first pillar portions 234, 434 may be formed from a material similar to that of the first pillar portions 134, 334 (FIG. 3C).

Figure 4B:
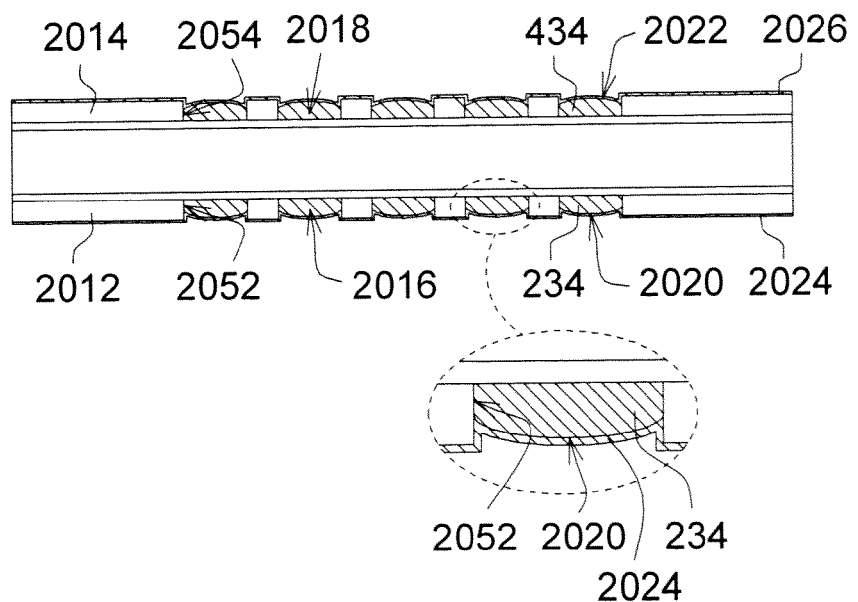

Referring to FIG. 4B, two conductive films 2024, 2026 are formed on the patterned layers 2012, 2014 and the curved base surfaces 2020, 2022 of the first pillar portions 234, 434, respectively. In certain embodiments, the conductive films 2024, 2026 may be formed by electroless plating, such that the conductive film 2024 can be continuously formed in the corner spaces between the sidewalls 2052 of the patterned layer 2012 and the curved base surfaces 2020 of the first pillar portions 234, and between the sidewalls 2054 of the patterned layers 2014 and the curved base surfaces 2022 of the first pillar portions 434. In this manner, dead space problems can be avoided. The conductive films 2024, 2026 may be formed from a metal, a metal alloy, a matrix with a metal or a metal alloy dispersed therein, or any other suitable electrically conductive material. For example, the conductive films 2024, 2026 may include one or more layers of copper or a copper alloy.

Figure 4C:
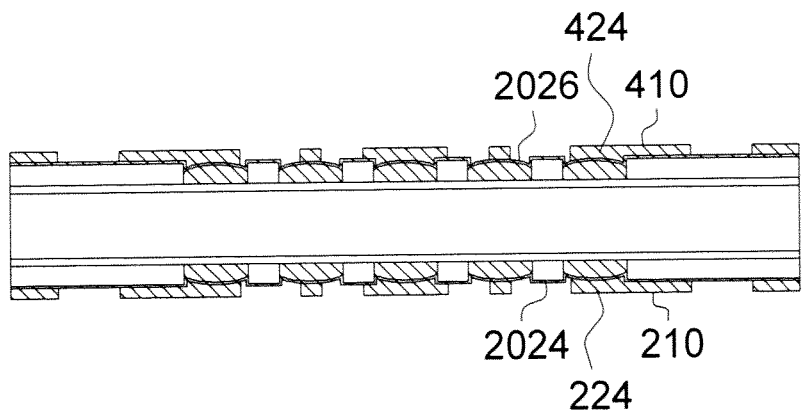

Referring to FIG. 4C, the first circuit patterns 210, 410 are formed on the conductive films 2024, 2026. The first circuit patterns 210, 410 include traces 224, 424 contacting the conductive films 2024, 2026. The first circuit patterns 210, 410 may be formed similarly to the first circuit patterns 110, 310 described above with reference to FIG. 3E.

Figure 4D:
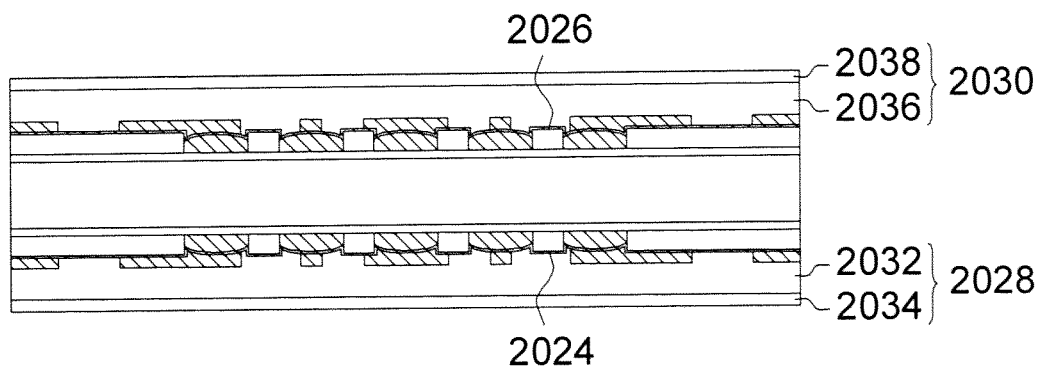

Referring to FIG. 4D, films 2028, 2030 are formed. The film 2028 may include a dielectric layer 2032 and a conductive film 2034. The film 2030 may include a dielectric layer 2036 and a conductive film 2038. The films 2028, 2030 may be formed similarly to the films 1028, 1030 described above with reference to FIG. 3F.

Figure 4E:
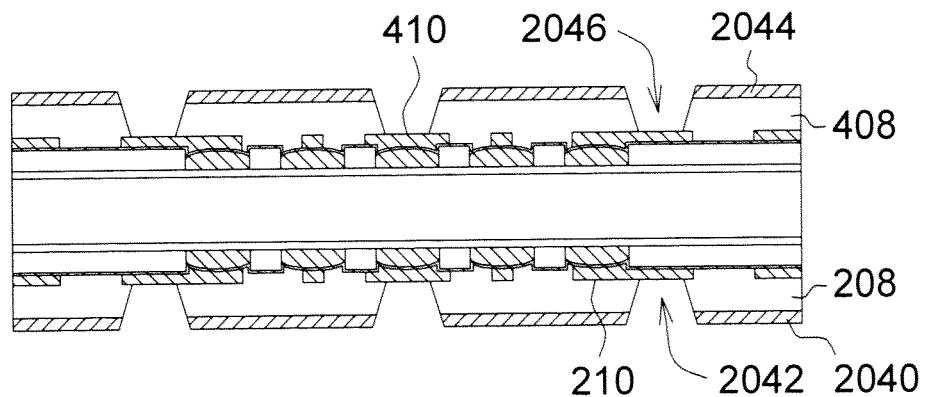

Next, portions of the dielectric layer 2032 and the conductive film 2034 of the film 2028 (FIG. 4D) are removed to form in a first dielectric layer 208 and a patterned conductive film 2040 defining a plurality of openings 2042 exposing portions of the first circuit pattern 210, as shown in FIG. 4E. In addition, portions of the dielectric layer 2036 and the conductive film 2038 of the film 2030 (FIG. 4D) are removed to form a first dielectric layer 408 and a patterned conductive film 2044 defining a plurality of openings 2046 exposing portions of the first circuit pattern 410. The first dielectric layers 208, 408 and the patterned conductive films 2040, 2044 may be formed similarly to the first dielectric layers 108, 308 and the patterned conductive films 1040, 1044 described above with reference to FIG. 3G.

Figure 4F:
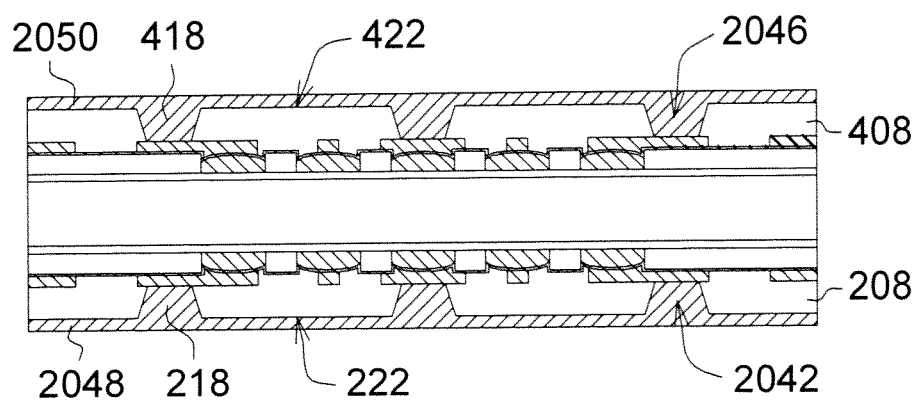

Referring to FIG. 4F, a conductive material is formed in the openings 2042, 2046 in the first dielectric layer 208, 408 and the patterned conductive film 2040, 2044 (FIG. 4E) to form conductive vias 218, 418 and conductive films 2048, 2050 extending from the conductive vias 218, 418 on second dielectric surfaces 222, 422 of the first dielectric layers 208, 408. The conductive vias 218, 418 and the conductive films 2048, 2050 may be formed similarly to the conductive vias 118, 318 and the conductive films 1048, 1050 described above with reference to FIG. 3H.

Figure 4G:
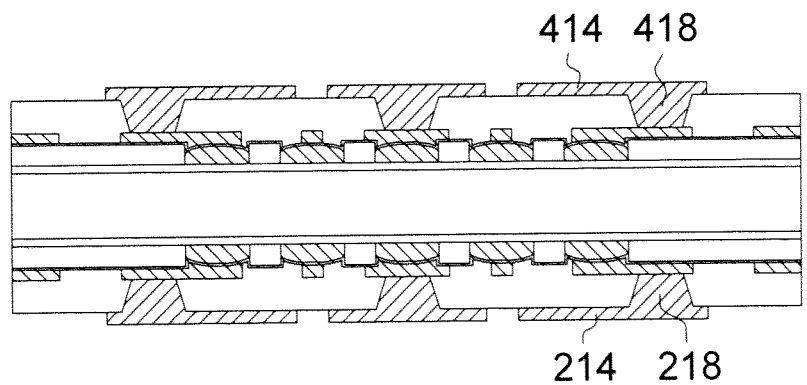

Next, the conductive film 2048 is patterned to form a second circuit pattern 214 electrically connected to the conductive vias 218, as shown in FIG. 4G. In addition, the conductive film 2050 (FIG. 4F) is patterned to form a second circuit pattern 414 electrically connected to the conductive vias 418. The second circuit patterns 214, 414 may be formed similarly to the second circuit patterns 114, 314 described above with reference to FIG. 3I.

Figure 4H:
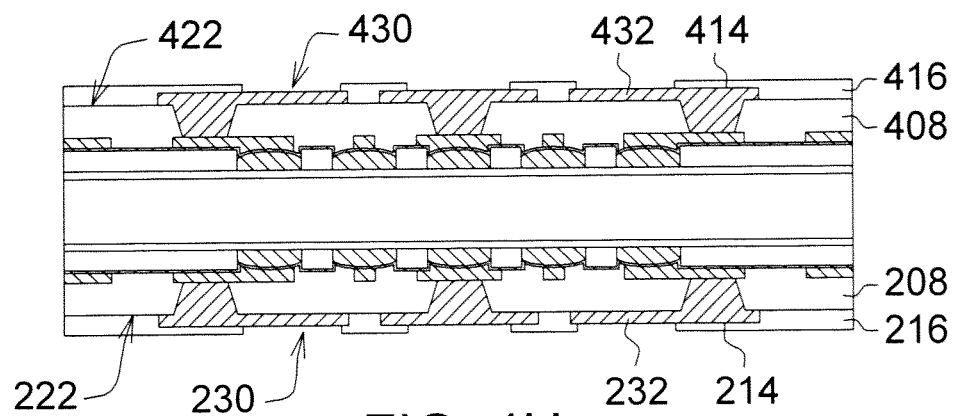
Figure 4I:
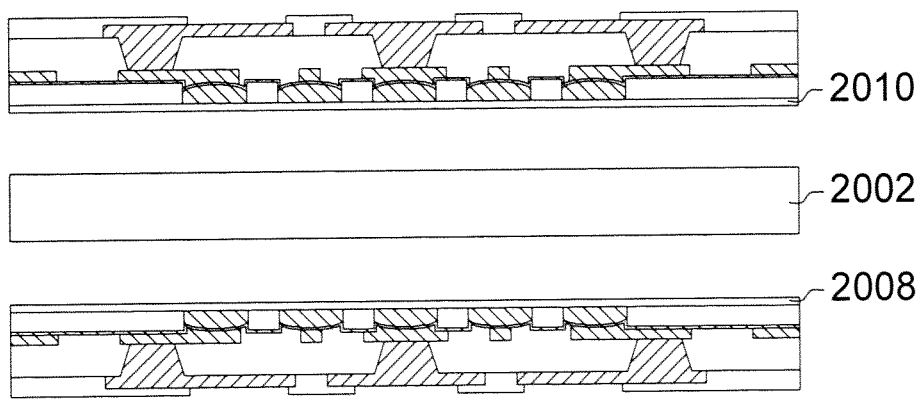

Referring to FIG. 4H, a second dielectric layer 216 is formed on the second dielectric surface 222 of the first dielectric layer 208 and on the second circuit pattern 214. The second dielectric layer 216 defines a plurality of openings 230 exposing portions of the second circuit pattern 214 to form a plurality of contact pads 232. A second dielectric layer 416 is formed on the second dielectric surface 422 of the first dielectric layer 408 and on the second circuit pattern 414. The second dielectric layer 416 defines a plurality of openings 430 exposing portions of the second circuit pattern 414 to form a plurality of contact pads 432. The second dielectric layers 216, 416 may be formed from solder resist (solder mask), or any other type of dielectric material.

Figure 4J:
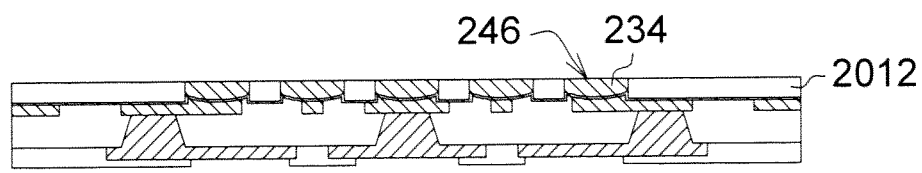

Referring to 4I, the carrier 2002 is removed to expose conductive layers 2008, 2010. Next, the conductive layer 2008 is removed to expose the exterior surfaces 246 of the first pillar portions 234 and the patterned layer 2012, as shown in FIG. 4J. The removal process may comprise etching, for example, or any other technique.

Figure 4K:
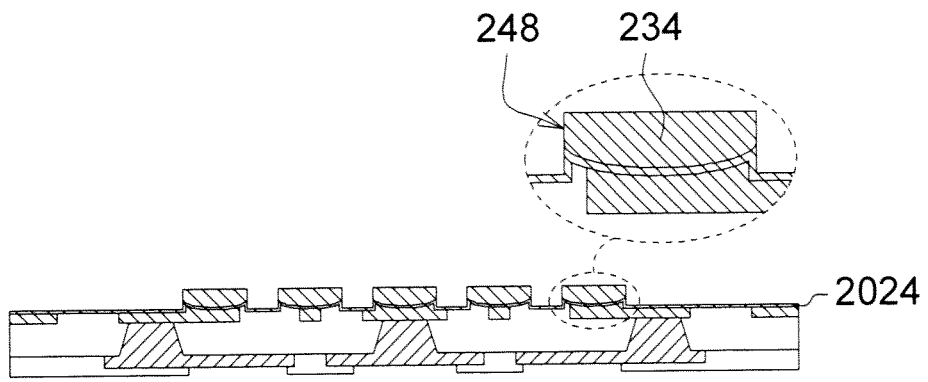

Next, the patterned layer 2012 is removed to expose sidewalls 248 of the first pillar portions 234 and portions of the conductive film 2024 outside the first pillar portions 234, as shown in FIG. 4K. The removal process may comprise stripping, for example, or any other technique.

Figure 4L:
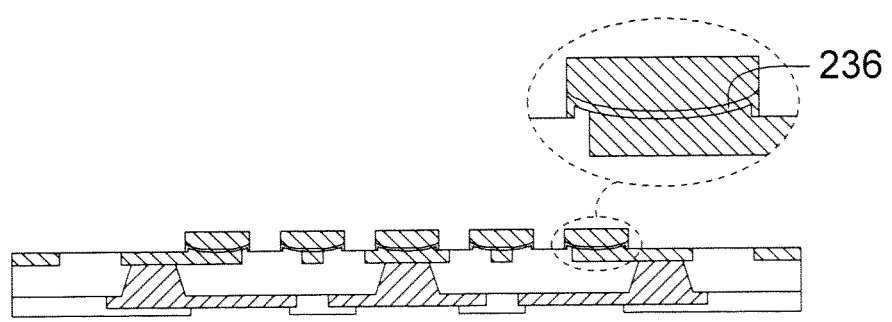

Next, the portions of the conductive film 2024 outside the sidewalls 248 of the first pillar portions 234 (FIG. 4K) are removed to form second pillar portions 236, as shown in FIG. 4L.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not necessarily be drawn to scale. There may be distinctions between the artistic renditions in the present disclosure and the actual apparatus due to making processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A substrate, comprising:
    a first dielectric layer having opposing first and second dielectric surfaces;
    a first circuit pattern embedded in the first dielectric layer, the first circuit pattern including a plurality of traces defining trace surfaces exposed from the first dielectric surface, the trace surfaces including curved portions that are recessed beneath the first dielectric surface;
    a plurality of pillars, each of the pillars having a curved base surface abutting a corresponding one of the curved portions of the trace surfaces, thereby defining a curved interface between each of the pillars and a corresponding one of the curved portions of the trace surfaces; and
    a second circuit pattern on the second dielectric surface of the first dielectric layer and electrically connected to the first circuit pattern.

2. The substrate of claim 1, further comprising a second dielectric layer abutting the second dielectric surface of the first dielectric layer and covering portions of the second circuit pattern.

3. The substrate of claim 1, wherein the curved base surface of each of the pillars is convex.

4. The substrate of claim 3, wherein each of the curved portions of the trace surfaces is concave.

5. The substrate of claim 1, wherein each of the pillars includes two discrete portions abutting one another.

6. The substrate of claim 1, wherein each of the pillars includes a first pillar portion spaced from a corresponding one of the trace surfaces, and a second pillar portion disposed between the first pillar portion and the corresponding one of the trace surfaces.

7. The substrate of claim 6, wherein each of the first pillar portions has a first width, each of the second pillar portions has a second width, and the second width is greater than the first width.

8. A substrate, comprising:
- a first dielectric layer having opposing first and second dielectric surfaces;
- a first circuit pattern embedded in the first dielectric layer, the first circuit pattern including a plurality of traces defining trace surfaces exposed from the first dielectric surface, the trace surfaces defining concave portions extending outward from the first dielectric surface; and
- a plurality of pillars, each of the pillars having a convex base surface abutting a corresponding one of the concave portions of the trace surfaces, thereby defining a concave/convex interface between each of the pillars and a corresponding one of the trace surfaces.

9. The substrate of claim 8, wherein an apex of each of the concave portions lies substantially in the plane of the first dielectric surface.

10. The substrate of claim 8, further comprising a second circuit pattern on the second dielectric surface of the first dielectric layer and electrically connected to the first circuit pattern.

11. The substrate of claim 10, further comprising a second dielectric layer abutting the second dielectric surface of the first dielectric layer and covering portions of the second circuit pattern.

12. The substrate of claim 8, wherein each of the pillars includes two discrete portions abutting one another.

13. The substrate of claim 8, wherein each of the pillars includes a first pillar portion spaced from a corresponding one of the trace surfaces, and a second pillar portion disposed between the first pillar portion and the corresponding one of the trace surfaces.

14. The substrate of claim 13, wherein each of the second pillar portions comprises a conductive film.

15. The substrate of claim 13, wherein each of the second pillar portions includes a side surface that meets the curved base surface at an acute angle.

16. A method of making a substrate, comprising:
- forming a patterned layer on a carrier, the patterned layer defining a plurality of openings;
- forming a plurality of first pillar portions of a plurality of pillars in the plurality of openings in the patterned layer;
- forming a conductive film covering the plurality of first pillar portions of the plurality of pillars and the patterned layer;
- forming a first circuit pattern on the patterned layer, the first circuit pattern defining a plurality of trace surfaces;
- forming a first dielectric layer on the first circuit pattern and the patterned layer;
- forming a plurality of first openings in the first dielectric layer;
- forming a plurality of conductive vias in the first dielectric layer and a second circuit pattern on the first dielectric layer, the plurality of conductive vias being in the plurality of first openings in the first dielectric layer, the first circuit pattern being electrically connected to the second circuit pattern via the plurality of conductive vias;
- forming a second dielectric layer covering portions of the second circuit pattern and defining a plurality of second openings, the second circuit pattern including a plurality of contact pads exposed by the plurality of second openings in the second dielectric layer;
- removing the carrier;
- removing the patterned layer; and
- removing portions of the conductive film that are not covered by the first pillar portions, wherein the remaining part of the conductive film forms a plurality of second pillar portions of the plurality of pillars.

17. The method of claim 16, each of the pillars has a curved base surface abutting a corresponding one of the trace surfaces at a curved interface.

18. The method of claim 17, wherein the first pillar portions overfill corresponding ones of the openings in the patterned layer to form the curved base surfaces.

19. The method of claim 16, wherein the conductive film is formed by sputtering.

* * * * *